(12) United States Patent
Ma et al.

(10) Patent No.: US 7,049,669 B2
(45) Date of Patent: May 23, 2006

(54) LDMOS TRANSISTOR

(75) Inventors: Gordon Ma, Phoenix, AZ (US); Qiang Chen, Sollentuna (SE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/663,051

(22) Filed: Sep. 15, 2003

(65) Prior Publication Data

US 2005/0056889 A1   Mar. 17, 2005

(51) Int. Cl.
*H01L 29/76* (2006.01)

(52) U.S. Cl. .................. 257/401; 257/409; 438/286; 438/140

(58) Field of Classification Search ........... 257/409, 257/452, 484, 605, 170, 401, 408; 438/284, 438/286, 140, 454
See application file for complete search history.

(56) References Cited

U.S. PATENT DOCUMENTS

| | | | | | |
|---|---|---|---|---|---|
| 4,013,484 A | * | 3/1977 | Boleky et al. | ............. | 438/227 |
| RE31,079 E | * | 11/1982 | Nagasawa et al. | ............. | 29/571 |
| 4,468,852 A | * | 9/1984 | Cerofolini | ................... | 438/227 |
| 4,811,075 A | | 3/1989 | Eklund | ........................ | 357/46 |
| 5,026,656 A | * | 6/1991 | Matloubian et al. | ........ | 438/164 |
| 5,155,563 A | * | 10/1992 | Davies et al. | ................ | 257/327 |
| 5,192,993 A | * | 3/1993 | Arai et al. | .................. | 257/400 |
| 5,252,848 A | * | 10/1993 | Adler et al. | ................ | 257/328 |
| 5,313,082 A | | 5/1994 | Eklund | ....................... | 257/262 |
| 5,386,136 A | * | 1/1995 | Williams et al. | ............ | 257/409 |
| 5,485,027 A | * | 1/1996 | Williams et al. | ............ | 257/343 |
| 5,747,853 A | * | 5/1998 | So et al. | ...................... | 257/355 |
| 5,801,418 A | * | 9/1998 | Ranjan | ........................ | 257/336 |
| 5,844,276 A | * | 12/1998 | Fulford et al. | ............. | 257/336 |
| 5,900,663 A | * | 5/1999 | Johnson et al. | ............. | 257/343 |
| 5,949,104 A | * | 9/1999 | D'Anna et al. | ............. | 257/335 |
| 6,001,710 A | * | 12/1999 | Francois et al. | ............ | 438/454 |
| 6,168,983 B1 | | 1/2001 | Rumennik et al. | .......... | 438/188 |
| 6,258,640 B1 | * | 7/2001 | Miyazaki | .................... | 438/197 |
| 6,297,533 B1 | * | 10/2001 | Mkhitarian | .................. | 257/336 |
| 6,355,960 B1 | * | 3/2002 | Lin et al. | .................... | 257/355 |
| 6,372,557 B1 | * | 4/2002 | Leong | ......................... | 438/142 |
| 6,448,160 B1 | * | 9/2002 | Chang et al. | ............... | 438/527 |
| 6,538,291 B1 | * | 3/2003 | Ohoka | ......................... | 257/363 |
| 6,563,171 B1 | | 5/2003 | Disney | ........................ | 257/342 |
| 6,624,030 B1 | * | 9/2003 | Chang et al. | ............... | 438/268 |
| 6,710,416 B1 | * | 3/2004 | Xu | ............................. | 257/409 |
| 6,780,714 B1 | * | 8/2004 | Gajda et al. | ................ | 438/270 |
| 2001/0045670 A1 | * | 11/2001 | Nojiri | ........................ | 257/786 |
| 2002/0125540 A1 | * | 9/2002 | Shimotsusa et al. | ........ | 257/467 |
| 2002/0171098 A1 | * | 11/2002 | Nakaya et al. | ............. | 257/296 |
| 2003/0058027 A1 | * | 3/2003 | Kwon et al. | ................. | 327/401 |

OTHER PUBLICATIONS

J.A. Appels and H.M.J. Vaes, "High voltage thin layer devices (RESURF devices)", IEDM technical digest, pp. 238-241, 1979.

(Continued)

*Primary Examiner*—Kenneth Parker
*Assistant Examiner*—Eugene Lee
(74) *Attorney, Agent, or Firm*—Baker Botts L.L.P.

(57) ABSTRACT

A semiconductor device comprises an active region of a first conductivity type including a transistor structure, and a ring shaped region of the first conductivity type extending from a surface of the active region into the active region and substantially surrounding the transistor structure.

33 Claims, 4 Drawing Sheets

OTHER PUBLICATIONS

H.M.J. Vaes and J.A. Appels, "High voltage high current lateral devices", IEDM technical digest, pp. 87-90, 1980.

T. Fujihara, "Theory of Semiconductor Superjunction Devices", Jpn. J. Appl. Phys., vol. 36, pp. pp. 6254-6262, 1997.

G. Deboy, M. Marz, J.-P. Stengl, H. Strack, J. Tihanyi and H. Weber, "A new generation of high voltage MOSFETs breaks the limit line of silicon", IEDM technical digest, pp. 683-685, 1998.

A. Ludikhuize, "A review of RESURF technology", Proc. of ISPSD, p. 11, 2000.

J. Cai, C. Ren, N. Balasubramanian and J.K.O. Sin, A novel high performance stacked LDD RF LDMOSFET, IEEE Electron Device Lett., vol. 22, No. 5, pp. 236-238, 2001.

J.G. Mena and C.A.T. Salama, "High voltage multiple-resistivity Drift-Region LDMOS", Solid State Electronics, vol. 29, No. 6, pp. 647-656, 1986.

M.D. Pocha and R.W. Dutton, "A computer-aided design model for High-Voltage Double Diffused MOS (DMOS) Transistors", IEEE Journal of Solid-State Circuits, vol. SC-11, No. 5, 1976.

I. Yoshia, M. Katsueda, S. Ohtaka, Y. Maruyama and T. Okabe; "High Efficient 1.5 GHz Si Power MOSFET for Digital Cellular Front End"; Proceedings of International Symposium on Power Semiconductor Devices & ICs; Tokyo, pp. 156-157, 1992.

\* cited by examiner

LDMOS TRANSISTOR

FIELD OF THE INVENTION

The present application relates to an LDMOS transistor structure.

BACKGROUND OF THE INVENTION

LDMOS transistor structures are widely used in semiconductor devices for many types of transistor applications such as high voltage MOS field effect transistors. An LDMOS transistor comprises a lightly doped drain region to enhance the breakdown voltage. FIG. 1 shows a top view of a combined transistor structure including two MOSFET transistors. Both transistors are arranged within an active, for example, p doped area 1 that is isolated from the surroundings, by a so-called field region 11. The transistors share a common drain region consisting of a n+ doped region 9 surrounded by a n⁻ doped region 8. Two source regions 6, 7 are arranged on the left and the right side of this drain region 8, 9. Thus, two channels are defined by the drain region 8, 9 and the two source regions 6 and 7, respectively. The broken lines indicate the gates 4 and 5 which are arranged above these channels. To the left and the right of the source regions 6 and 7, there are arranged p⁺ sinker structures 2 and 3 which extend from the surface of epitaxial layer to the bottom of the substrate to provide for a source connection on the backside of the substrate.

The active region 1 can be enclosed by a single step, the LOCal Oxidation of Silicon (LOCOS) as known in the art. This process creates a so called high stress field oxide bird's beak region which in combination with the p⁺ sinker structure implants 2 and 3 can result in a leakage path between the n⁺ drain and the p⁺ sinker structure along the interface stress and implant damage induced defect centers as indicated by arrows 10.

The conventional solution to prevent such a leakage is to increase the spacing between p⁺ and n⁺ implants to the bird's beak to suppress the leakage current. The disadvantages of such a measurement is, however, the increase of the non-functional part of the transistor fingers and the reduction of the isolation region.

SUMMARY OF THE INVENTION

According to the present application, a new transistor structure is introduced which avoids such a leakage.

A semiconductor device comprises an active region of a first conductivity type including a transistor structure, and a ring shaped region of the first conductivity type extending from a surface of the active region into the active region and substantially surrounding the transistor structure.

The transistor structure may comprise, a drain region, a source region, wherein the drain and the source define a channel, a gate being arranged above said channel, and a sinker structure of said first conductivity type arranged substantially along said source region reaching from the surface of the active area next to the source region to the bottom of the active area. The p ring can be less doped than the sinker structure. The device may further comprise a metal layer on the backside of the semiconductor device. The transistor structure can be a two transistor structure comprising, a common drain region, a first source region arranged on one side of the common drain region, a second source region arranged on the respective opposite side of the drain region, wherein the drain region and the source regions each define a channel, a first and second gate being arranged above said channels, and a first and second sinker structure of said first conductivity type arranged substantially along said source regions reaching from the surface of the active area next to the respective source regions to the bottom of the active area. The drain region may comprise a lightly doped drain region. The ring can be doped in the range of $10^{14}$–$10^{15}$/cm². The active area can be created and enclosed by a LOCOS process. The active area may comprise a substrate and an epitaxial layer on top of said substrate. The first conductivity type can be the p type or n type. The ring can be created by masked ion implant. Boron can be used as a dopant. The ring may have a rectangular, circular, oval, or polygon shape. The ring may comprise at least one gap that does not substantially influence an insulating function of the ring.

According to another embodiment, a semiconductor device comprises an active region of a first conductivity type including a transistor structure, wherein the transistor structure comprises, a drain region of a second type, a channel, and a gate being arranged above said channel, and a ring shaped region of the first conductivity type extending from a surface of the active region into the active region and surrounding the transistor structure.

The device may further comprise a source region of the second type arranged along one side of the drain region, and a sinker structure of said first conductivity type arranged substantially along said source region reaching from the surface of the active area next to the source region to the bottom of the active area. The device can also further comprise a second source region arranged on the respective opposite side of the drain region, wherein the drain region and the source regions each define a channel, a first and second gate being arranged above said channels, and a first and second sinker structure of said first conductivity type arranged substantially along said source regions reaching from the surface of the active area next to the respective source regions to the bottom of the active area. Again, the drain region may comprise a lightly doped drain region and the device may further comprise a metal layer on the backside of the semiconductor device. The ring may be less doped than the sinker structure and can be doped in the range of $10^{14}$–$10^{15}$/cm². The active area can be created and enclosed by a LOCOS process. The active area may comprise a substrate and an epitaxial layer on top of said substrate. The first conductivity type can be the p type or n-type. The ring can be created by masked ion implant. Boron can be used as a dopant. The ring may have a rectangular, circular, oval, polygon, or partially open shape. The ring may further comprise at least one gap that does not substantially influence an insulating function of the ring.

A method of manufacturing a semiconductor device comprises the steps of:

forming an active region of a first conductivity type within a semiconductor material;

forming a transistor structure, and forming a ring shaped region of the first conductivity type extending from a surface of the active region into the active region and surrounding the transistor structure.

The step of forming a transistor structure may comprise the steps of forming a drain region of a second type, a source region of the second type arranged along one side of the drain region, and a sinker structure of said first conductivity type arranged substantially along said source region reaching from the surface of the active area next to the source region to the bottom of the active area. The method may further comprise the step of forming a second source region arranged on the respective opposite side of the drain region, and a first and second sinker structure of said first conductivity type arranged substantially along said source regions reaching from the surface of the active area next to the respective source regions to the bottom of the active area. The drain region can be formed in such a way that it comprises a lightly doped drain region. The method may further comprise the step of arranging a metal layer on the backside of the semiconductor device. The step of forming the ring may include the step of doping the ring less than the sinker structure. The ring can be doped in the range of $10^{14}$–$10^{15}$/cm$^2$. The active area can be created and enclosed by a LOCOS process. The ring can be created by masked ion implant. Boron may be used as a dopant. The ring can have a rectangular, circular, oval, polygon, or partially open shape.

Other technical advantages of the present disclosure will be readily apparent to one skilled in the art from the following figures, descriptions, and claims.

BRIEF DESCRIPTION OF THE DRAWINGS

A more complete understanding of the present disclosure and advantages thereof may be acquired by referring to the following description taken in conjunction with the accompanying drawings, in which like reference numbers indicate like features, and wherein.

DETAILED DESCRIPTION OF THE PREFERRED EMBODIMENTS

Figure 1:
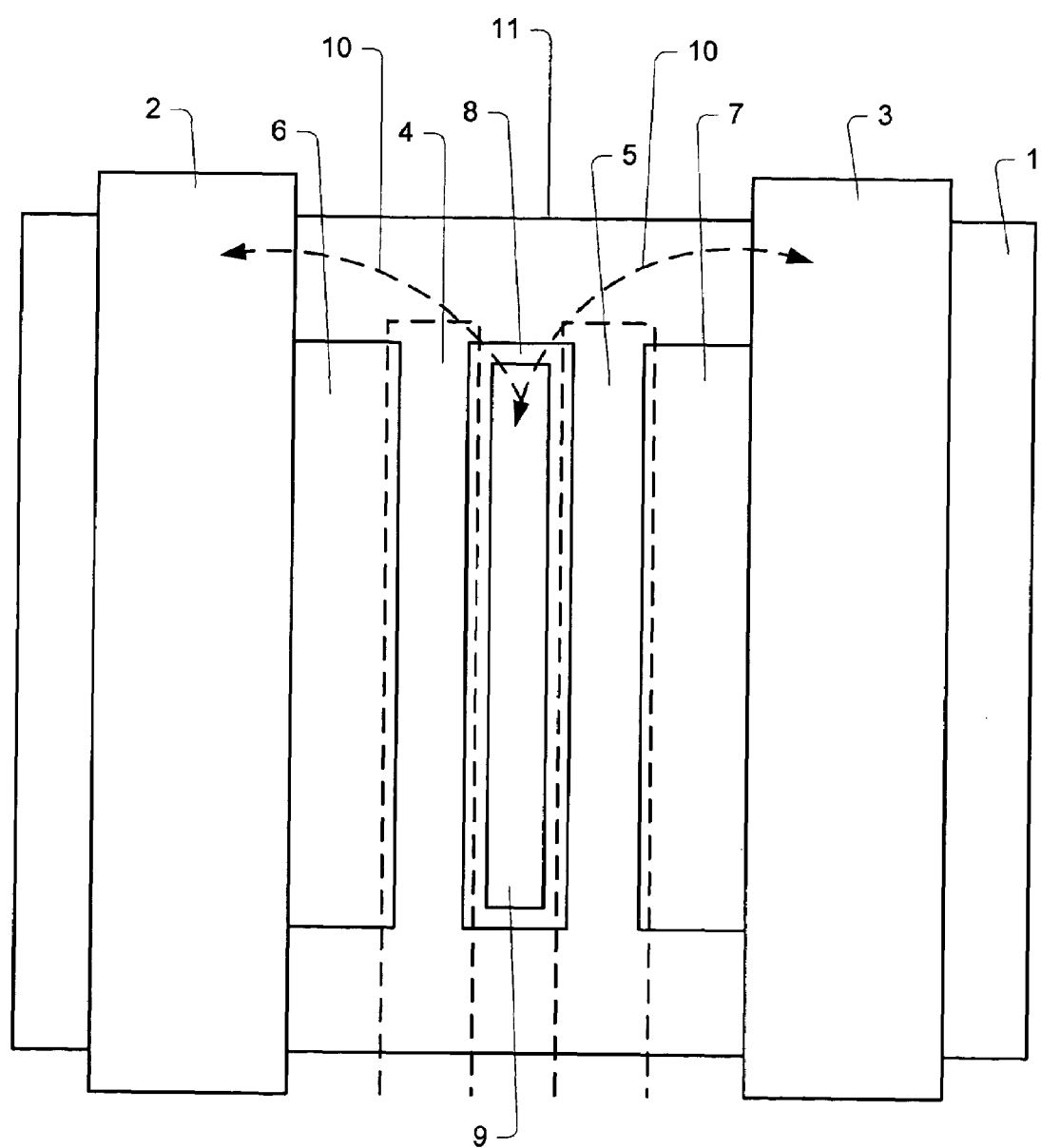
FIG. 1 is a top view of a combined transistor structure enclosed by a LOCOS area according to the prior art.
Figure 2:
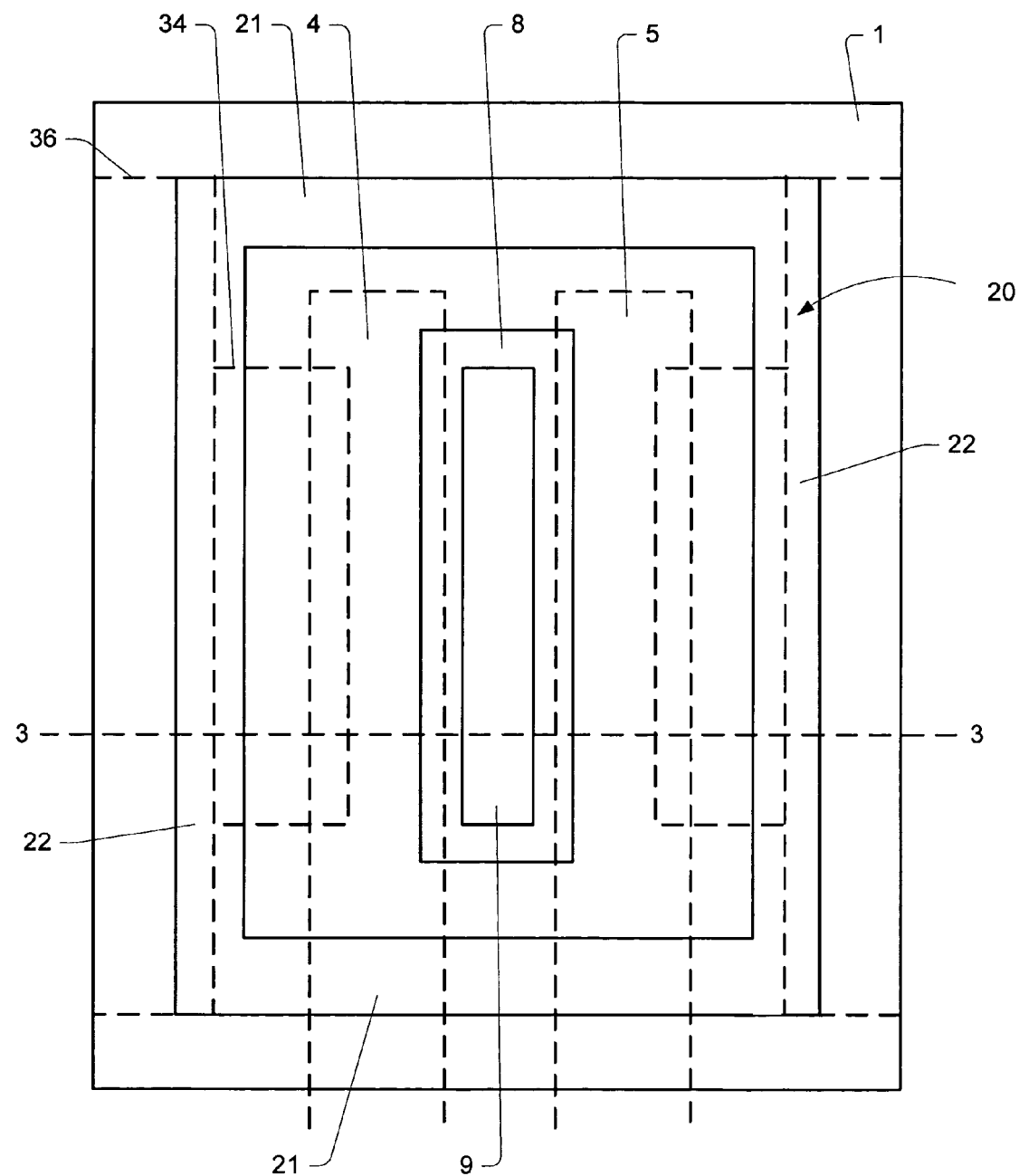
FIG. 2 is a top view of a combined transistor structure enclosed by a LOCOS area according to an embodiment of the present invention.

Turning to the drawings, an exemplary embodiment of the present application will now be described. FIG. 2 depicts a similar transistor structure as shown in FIG. 1. This figure only shows the drain region and indicates the, sinker, the source region, and the gates by broken lines. Similar structures and elements carry similar numerals. Within the active area 1, an additional p doped ring structure 20 is implanted that extends from the surface of the active area 1 into the epitaxial layer to additionally isolate transistor structures as will be shown in more detail in FIG. 3. FIG. 2 shows the p doped ring as rectangular ring structure with two parallel "vertical" areas 22 and two parallel "horizontal" areas 21. However, other forms, such as a circle, oval, hexagonal, or any other polygon shape can be used. The such formed inter-unit cell p ring 20 completely surrounds both transistors. The p ring profile can be generated by masked ion implant, for example, with a boron dose in the range of $10^{14}$–$10^{15}$/cm$^2$. The inter-unit cells p ring, thus, is created with a lower dose than the p$^+$ sinker and is used to terminate the electrical field (depletion region) at the end of the unit cells to prevent the electrical field to come in contact with the defect centers, thus limiting the leakage current and providing the leakage current insulating function. The lower dose p ring design reduces the implant damage, improves the source resistance, and suppresses the snapback behavior For a conventional device, the depletion edge extends along the end of the drain fingers 8, 9 with increasing drain bias. A drain to source leakage path can be formed when the depletion region, in case of an electrical field>0, starts covering the stress and implant damage induced defect centers. As stated above, the inter-unit cells p ring terminates the electrical field (depletion region) at the end of unit cells and effectively prevents the electrical field to come in contact with the defect centers and, thus, suppress the leakage current.

Figure 3:
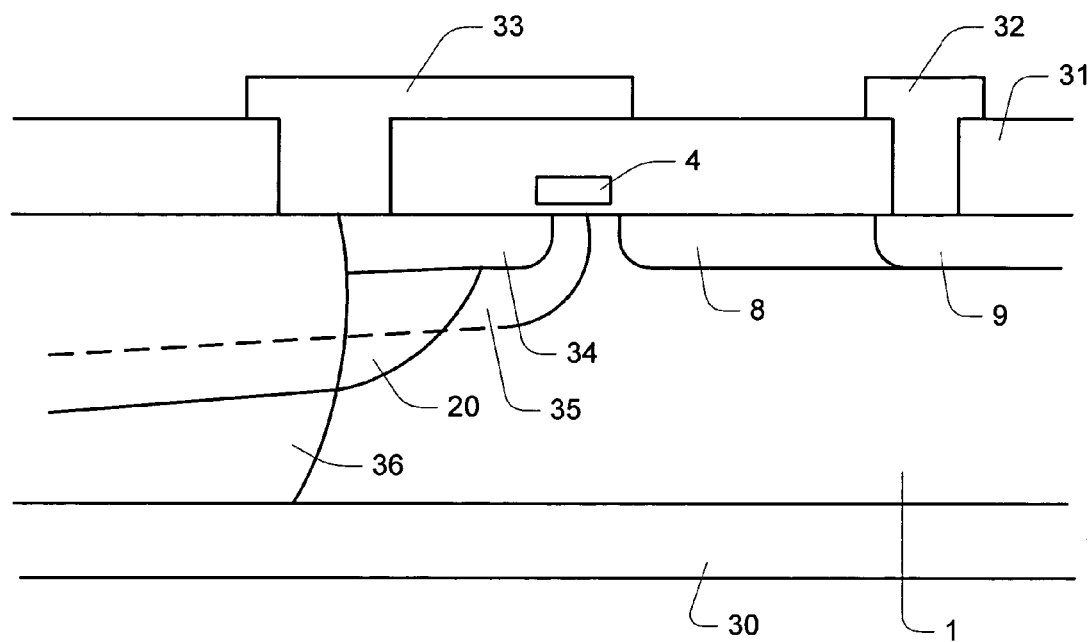
FIG. 3 is a sectional view along the line 3—3 in FIG. 2.

FIG. 3 shows the P ring profile within the transistor structure in a sectional view along the line 3—3 of FIG. 2. However, only a partial view is presented and, thus, only the left transistor is shown in this figure. A wafer comprises for example an active p-area created by the LOCOS process which includes n-type areas 8, 9 and 34 implanted on the surface to provide a drain and source region, respectively. The backside of the substrate comprises a wafer backside metal layer 30 which can be made of gold or aluminum and is used for contact purposes. The area 1 is usually covered with an insulator layer 31 such as silicon oxide in which a polysilicium gate 4 is arranged to cover the channel between the drain region 8 and source region 34. On top of this layer is usually a passivation layer (not indicated in FIG. 3). The source 34 in this exemplary LDMOS transistor can be additionally surrounded by a p doped well 35 depending on what type of technology is used. Electrodes 33 and 32 made of gold or aluminum or any other suitable metal reach through the insulating layer 31 to provide respective couplings between runners for the drain and the source regions, respectively. Runners can also be contacted with the respective drain, source and gate regions by other suitable means, such as, vias or similar coupling structures. To generally reduce a feedback capacitance, the source runner 33 is here extended to cover the gate 4 as shown in FIG. 3. Such a so called field plate over the gate 4 effectively decouples the gate drain capacitance $C_{gd}$ between the gate and the drain. However, other embodiments for the runners are possible. A p$^+$ sinker implant 36 similar as used in the prior art embodiment of FIG. 1 is shown on the left side of the source 34 of the left transistor. Such a p$^+$ sinker 36 can be created by ion implantation. Effectively, this p$^+$ sinker merges with the p well area 35 and, thus, reaches from the source runner contact 33 to the backside metal layer 30. Contrary to the p$^+$ sinker 36, the p ring 20 surrounds or encloses the transistor structure. As shown in FIG. 3, the p ring structure extends from the surface of the active area 1 downwards. Furthermore, the p ring 20 partially overlaps with the p$^+$ sinker and the source region 34 in areas 22 (see FIG. 2) where the source 34 and the p$^+$ sinker 36 are located. As indicated in FIG. 2, these areas 22 extend along the left and the right side of the drain regions 8, 9. Thus, the p ring 20 in FIG. 3 reaches from the surface into the active area in the areas 21 and 22 (as shown in FIG. 2) and encloses the combined transistor. Again, the p+sinker 36 can reach over the boundaries of the active area 1. However, the p ring 20 is completely located within the active area 1. As also indicated in FIG. 2, the p ring 20 can reach the right and left sides of the field oxide. (LOCOS edge). If no sinker structure is present, this can be done by designing the ring to extend from the left and right side into the active area. However, as shown in FIG. 2, if a p$^+$ sinker is used it will merge with the p ring 20 and thus, p ring 20 can extend to the edge of the field oxide.

Although particular embodiments of the invention have been shown and described, the invention is not limited to the preferred embodiments and it will be apparent to those skilled in the art that various changes and modifications may be made without departing from the scope of the invention, which is defined only by the appended claims and their equivalents. For example, the embodiment shown describes a combined dual transistor arrangement. However, the principle of an insulating ring according to the present application can also be applied to structures with more than two transistors or to a single transistor structure. Furthermore, the substrate/epitaxial layer can be a p-type or an n-type substrate. Thus, source, drain region, the p ring, and other doped areas would be according to their function either of the n-type or the p-type.

Figure 4:
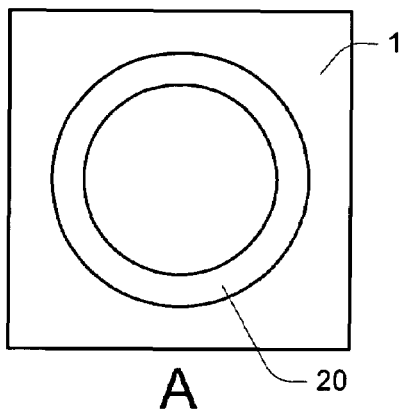
FIG. 4 shows different possible shapes of the inter unit cell ring.
Figure 4:
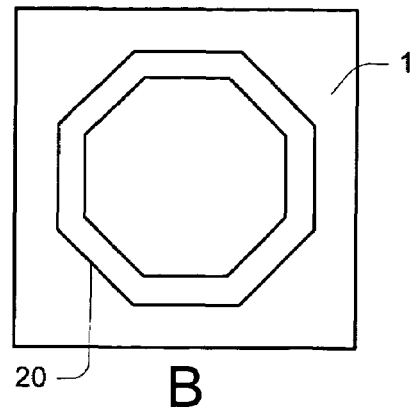
Figure 4:
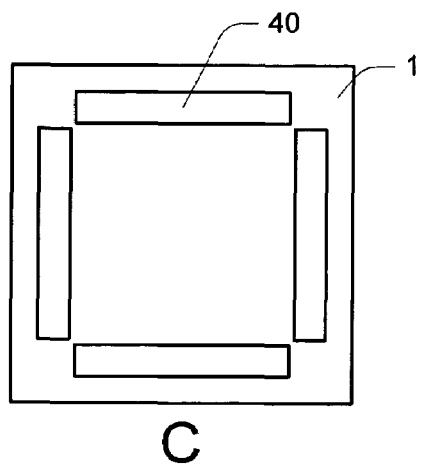
Figure 4:
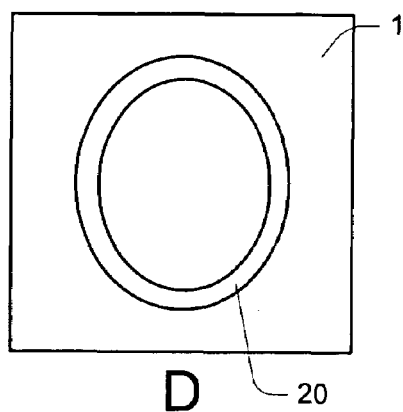
Figure 4:
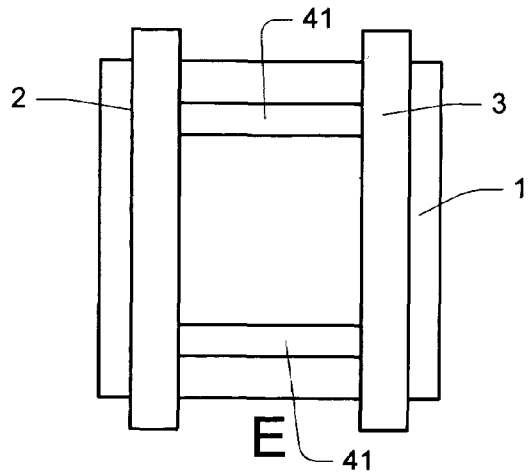
Figure 4:
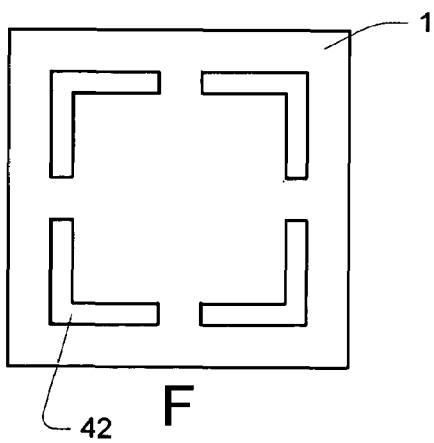

Furthermore, the ring structure does not have to be in a rectangular form as shown in FIG. 2. Depending on the form of the transistor structure other suitable surrounding shapes can be used, such as a circle, oval, hexagonal, or any other polygon shape. FIGS. 4A–F shows an exemplary variety of different ring shapes. For example, FIG. 4A depicts a circle shape, FIG. 4B a polygon shape, and FIG. 4D an oval shape. The main function is to insulate the electrical field. Therefore, depending on the structure of the transistor the ring might have some openings as long as they do not influence the substantially the shielding function. FIG. 4C, thus, shows another rectangular or square shape formed by four elements 40. These elements 40 can merge at their respective ends to form a continuous rectangular ring structure but also could have small gaps as long as the insulating function is kept. FIG. 4F shows another example, of a four element structure 42 with gaps at less critical areas of the ring. In FIG. 4E only two elements 41 are provided in the "horizontal" areas. These elements 41 merge with the p$^+$ sinker structures and, thus, form the insulating ring. Any other ring structure or combination of elements is possible to reach a similar result.

What is claimed is:

1. A semiconductor device comprising:
   an active region of a first conductivity type including a two transistor structure comprising a stripe shaped drain region and a first stripe shaped source region arranged on one side of the stripe shaped drain region and a second stripe shaped source region arranged on the opposite side of the stripe shaped drain region, wherein the drain and the first and second source each define a first and second stripe shaped channel, a first and second gate being arranged above said first and second channel,
   a ring shaped region of the first conductivity type extending from a surface of the active region into the active region, wherein the ring shaped structure partially overlaps the first and second stripe shaped source region and, thus, substantially surrounds the transistor structure.

2. The device as in claim 1, wherein the transistor structure further comprises a first and second sinker structure of said first conductivity type arranged substantially along said first and second source region, respectively reaching from the surface of the active area next to the first and second source region to the bottom of the active area.

3. The device as in claim 2, wherein the p ring is less doped than the first or second sinker structure.

4. The device as in claim 2, wherein the drain region comprises a lightly doped drain region.

5. The device as in claim 4, further comprising a metal layer on the backside of the semiconductor device.

6. The device as in claim 1, wherein the drain region comprises a lightly doped drain region.

7. The device as in claim 1, further comprising a metal layer on the backside of the semiconductor device.

8. The device as in claim 1, wherein the ring shaped region is less doped than the sinker structure.

9. The device as in claim 1, wherein the ring is doped in the range of $10^{14}$–$10^{15}$/cm$^2$.

10. The device as in claim 9 wherein boron is used as a dopant.

11. The device as in claim 1, wherein the active area comprises a substrate and an epitaxial layer on top of said substrate.

12. The device as in claim 1, wherein the first conductivity type is the p type.

13. The device as in claim 1, wherein the ring has a rectangular, circular, oval, or polygon shape.

14. The device as in claim 1, wherein the ring comprises at least one gap that does not substantially influence an insulating function of the ring.

15. A semiconductor device comprising:
    an active region of a first conductivity type including a two transistor structure, wherein the two transistor structure comprises, a common drain region of a second type, a first source region of the second type arranged along one side of the common drain region, a second source region of the second type arranged on the respective opposite side of the common drain region, first and second channels formed between said first source region and said common drain region and between said second source region and said common drain region, and first and second gates being arranged above said first and second channel, respectively, and
    a ring shaped region of the first conductivity type extending from a surface of the active region into the active region thereby partially overlapping said first and second source region and surrounding the transistor structure.

16. The device as in claim 15, further comprising first and second sinker structures of said first conductivity type arranged substantially along said first and second source regions, respectively reaching from the surface of the active area next to the source region to the bottom of the active area.

17. The device as in claim 16, further comprising a metal layer on the backside of the semiconductor device.

18. The device as in claim 16, wherein the ring is less doped than the first and second sinker structures.

19. The device as in claim 15, wherein the drain region comprises a lightly doped drain region.

20. The device as in claim 15, wherein the ring is doped in the range of $10^{14}$–$10^{15}$/cm$^2$.

21. The device as in claim 20, wherein boron is used as a dopant.

22. The device as in claim 15, wherein the active area comprises a substrate and an epitaxial layer on top of said substrate.

23. The device as in claim 15, wherein the first conductivity type is the p type.

24. The device as in claim 15, wherein the ring has a rectangular, circular, oval, polygon, or partially open shape.

25. The device as in claim 15, wherein the ring comprises at least one gap that does not substantially influence an insulating function of the ring.

26. A method of manufacturing a semiconductor device comprising the steps of:
    forming an active region of a first conductivity type within a semiconductor material;
    forming a transistor structure comprising a stripe shaped drain region and a first stripe shaped source region arranged on one side of the stripe shaped drain region and a second stripe shaped source region arranged on the opposite side of the stripe shaped drain region, wherein the drain and the first and second source each define a first and second stripe shaped channel, respectively, a first and second gate being arranged above said first and second channel, respectively, and forming a ring shaped region of the first conductivity type extending from a surface of the active region into the active region, wherein the ring shaped structure partially overlaps the first and second stripe shaped source regions and, thus, surrounds the transistor structure.

27. The method as in claim 26, wherein the step of forming a transistor structure comprises the step of forming a sinker structure of said first conductivity type arranged substantially along said source region reaching from the surface of the active area next to the source region to the bottom of the active area.

28. The method as in claim 27, further comprising the step of arranging a metal layer on the backside of the semiconductor device.

29. The method as in claim 26, wherein the drain region is formed in such a way that it comprises a lightly doped drain region.

30. The device as in claim 26, wherein the step of forming the ring includes the step of doping the ring less than the sinker structure.

31. The method as in claim 26, wherein the ring is doped in the range of $10^{14}$–$10^{15}$/cm$^2$.

32. The method as in claim 26, wherein boron is used as a dopant.

33. The method as in claim 26, wherein the ring has a rectangular, circular, oval, polygon, or partially open shape.

* * * * *